(12) United States Patent
Do et al.

(10) Patent No.: US 8,713,383 B2
(45) Date of Patent: *Apr. 29, 2014

(54) SEMICONDUCTOR MEMORY DEVICE, TEST CIRCUIT, AND TEST OPERATION METHOD THEREOF

(75) Inventors: Chang-Ho Do, Gyeonggi-do (KR); Yeon-Woo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 358 days.

This patent is subject to a terminal disclaimer.

(21) Appl. No.: 12/982,409

(22) Filed: Dec. 30, 2010

(65) Prior Publication Data

US 2012/0173942 A1 Jul. 5, 2012

(51) Int. Cl.
*G01R 31/28* (2006.01)

(52) U.S. Cl.
USPC .......................................................... 714/718

(58) Field of Classification Search
USPC ................................................. 714/718, 719
See application file for complete search history.

(56) References Cited

U.S. PATENT DOCUMENTS

| | | | | |
|---|---|---|---|---|
| 3,878,510 A | * | 4/1975 | Smith | 307/115 |
| 4,315,247 A | * | 2/1982 | Germanton | 340/5.6 |
| 6,058,495 A | * | 5/2000 | Lee et al. | 714/718 |
| 6,061,282 A | * | 5/2000 | Tamaki | 365/201 |
| 6,166,967 A | | 12/2000 | Do | |
| 6,499,121 B1 | * | 12/2002 | Roy et al. | 714/724 |
| 6,550,026 B1 | * | 4/2003 | Wright et al. | 714/719 |
| 7,246,280 B2 | | 7/2007 | Kim et al. | |
| RE40,172 E | | 3/2008 | Do | |
| 8,325,539 B2 | * | 12/2012 | Park | 365/189.07 |
| 2002/0188900 A1 | * | 12/2002 | Takeshige et al. | 714/719 |
| 2006/0291299 A1 | * | 12/2006 | Nanba | 365/189.07 |
| 2008/0215939 A1 | * | 9/2008 | Ahn et al. | 714/719 |
| 2008/0222460 A1 | * | 9/2008 | Kim et al. | 714/702 |
| 2009/0259895 A1 | * | 10/2009 | Jung | 714/718 |
| 2011/0004793 A1 | * | 1/2011 | Sul et al. | 714/718 |

FOREIGN PATENT DOCUMENTS

| | | |
|---|---|---|
| KR | 1020090122677 | 12/2009 |
| KR | 1020100050138 | 5/2010 |

* cited by examiner

*Primary Examiner* — Michael Maskulinski
*Assistant Examiner* — Neil Miles
(74) *Attorney, Agent, or Firm* — IP & T Group LLP (57) ABSTRACT

A semiconductor memory device includes a plurality of banks, each including a plurality of first memory cells and a plurality of second memory cells; a first input/output unit configured to transfer first data between the first memory cells and a plurality of first data pads; a second input/output unit configured to transfer second data between the second memory cells and a plurality of second data pads; a path selection unit configured to transfer the first data, which are input through the first data pads, to both the first and second memory cells during a test mode; and a test mode control unit configured to compare the first data of the first and second memory cells, and to control at least one of the first data pads to denote a fail status based on a comparison result, during the test mode.

16 Claims, 7 Drawing Sheets

SEMICONDUCTOR MEMORY DEVICE, TEST CIRCUIT, AND TEST OPERATION METHOD THEREOF

BACKGROUND OF THE INVENTION

Exemplary embodiments of the present invention relate to semiconductor memory devices, and more particularly, to a semiconductor memory device, a test circuit and a test operation method thereof.

A dynamic random access memory (DRAM), which is widely used among memory devices, includes a plurality memory cells for storing data. As the number of memory cells integrated in the semiconductor memory device increases, more time and money are consumed for testing the memory cells in the semiconductor memory device. Therefore, a parallel test scheme has been developed and applied to test memory cells of a semiconductor memory device at a wafer or a package level.

According to the parallel test scheme, test data are inputted to two or more memory cells in a bank of a semiconductor memory device. The memory cells store and output the test data. The outputted test data are compared to determine whether or not the memory cells have a defect.

A conventional semiconductor memory device includes an additional test pin on a chip to output the comparison result, i.e., a test result. In order to reduce the chip size, there are demands for a circuitry that may test a semiconductor memory device without the additional test pin, and decrease a test time.

SUMMARY OF THE INVENTION

Exemplary embodiments of the present invention are directed to a semiconductor memory device capable of decreasing a test time of a plurality of unit cells.

In accordance with an exemplary embodiment of the present invention, a semiconductor memory device includes a plurality of banks, each including a plurality of first memory cells and a plurality of second memory cells, a first input/output unit configured to transfer first data between the first memory cells and a plurality of first data pads, a second input/output unit configured to transfer second data between the second memory cells and a plurality of second data pads, a path selection unit configured to transfer the first data, which are input through the first data pads, to both the first and second memory cells, during a test mode and a test mode control unit configured to compare the first data of the first and second memory cells, and to control at least one of the first data pads to denote a fail status based on a comparison result, during the test mode, wherein the test mode control unit controls the one of the first data pads to a stuck state after a read operation is finished.

In accordance with another exemplary embodiment of the present invention, a method of testing a semiconductor memory device includes transferring data, which is input through a data pad, to first and second memory cells of a bank, comparing the data of the first memory cell with the data of the second memory cell to output a fail detection signal based on the comparison result, generating a fail latch signal by latching the fail detection signal in response to a test mode signal activated during the test mode, and a strobe signal toggled when a read command is input, generating a fail signal based on the fail latch signal and the test mode signal, and driving at least one of the data pad to denote a fail stuck status based on the fail signal.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
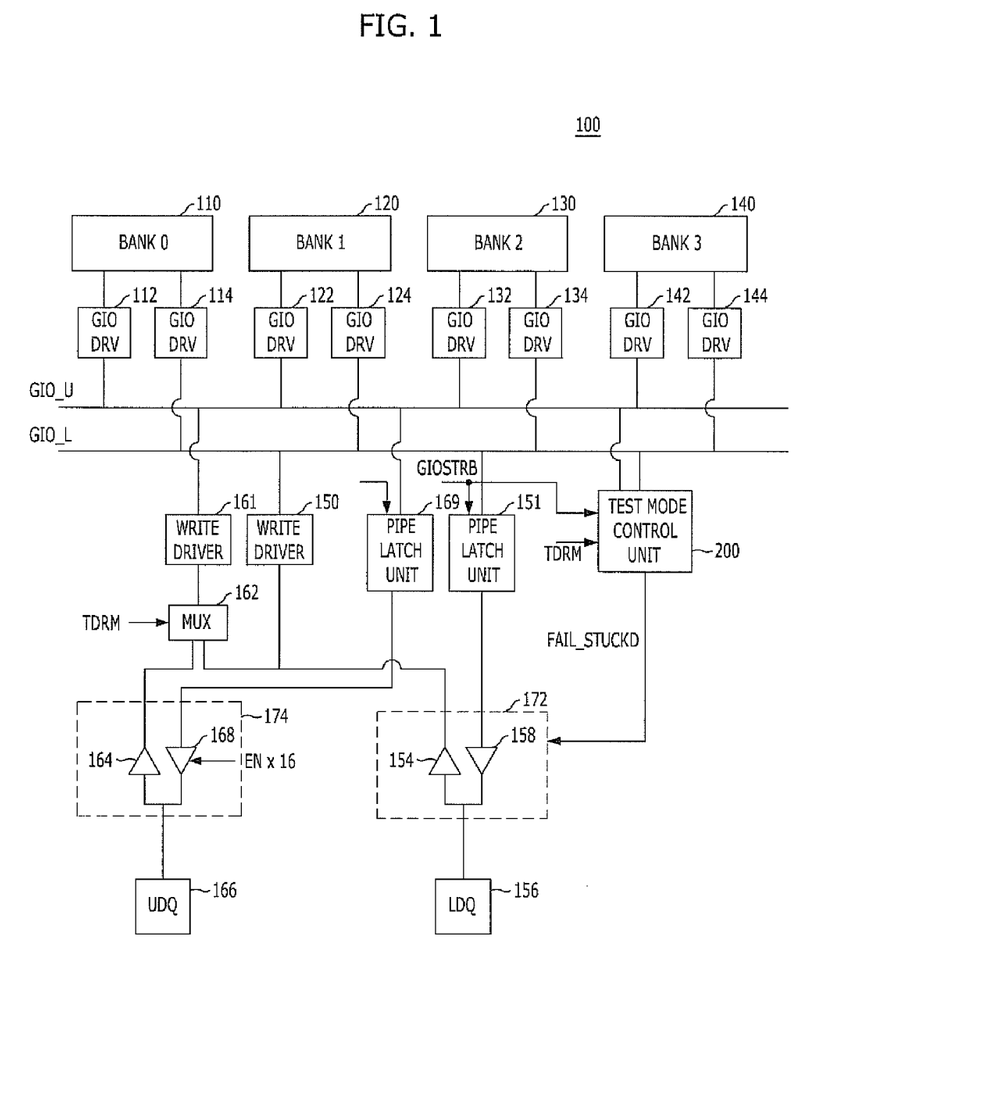
FIG. 1 illustrates a block diagram illustrating a semiconductor memory device in accordance with an exemplary embodiment of the present invention.

FIG. 1 illustrates a block diagram illustrating a semiconductor memory device in accordance with an embodiment of the present invention.

Referring to FIG. 1, the semiconductor memory device includes a plurality of banks, for example, four banks, 110 to 140, global input/output (GIO) line drivers 112 to 144, write drivers 150 and 161, pipe latch units 151 and 169, a multiplexer 162, input/output (I/O) drivers 172 and 174, and a test mode control unit 200.

The I/O drivers 172 and 174 are configured to drive data inputted/outputted from/to data pads LDQ and UDQ, respectively. In more detail, the I/O drivers 172 and 174 are provided with input buffers 154 and 164 and output drivers 158 and 168, respectively. The input buffers 154 and 164 receive data inputted from the data pads LDQ and UDQ, respectively. The input buffer 154 outputs the data it receives to the write driver 150 and the multiplexer 162. The input buffer 164 outputs the data it receives to the multiplexer 162. Further, the output drivers 158 and 168 receive data outputted from the pipe latch units 151 and 169, and output data to the data pads LDQ and UDQ, respectively. In accordance with this exemplary embodiment of the present invention, in a test mode, the output driver 158 drives the data pad LDQ to maintain a high-stuck state in response to a fail-stuck signal FAIL_STUCKD.

The write drivers 150 and 161 transfer data to corresponding memory cells of the banks 110 to 140. The pipe latch units 151 and 169 output data of the corresponding GIO lines GIO_L and GIO_U to the data pads LDQ and UDQ through the output drivers 158 and 168, respectively. The memory cells included in the banks 110 to 140 store data and output the stored data through the corresponding GIO lines GIO_L and GIO_U.

In accordance with this embodiment of the present invention, in the test mode, the multiplexer 162 selects a path between the write driver 161 and the input buffer 154 in response to a test mode signal TDRM. Here, the test mode signal TDRM is a signal which is activated during the test mode of a semiconductor memory device. As a result, while the write driver 150 transfers test data inputted from the data pad LDQ to memory cells coupled to the GIO lines GIO_L, and the write driver 161 also transfers the same test data inputted from the data pad LDQ to memory cells coupled to the GIO lines GIO_U. That is, both of the write drivers 150 and 161 receive the test data from the data pad LDQ and transfer the test data to respective memory cells in the banks 110 to 140.

In a normal mode, the multiplexer 162 selects a path between the write driver 161 and the input buffer 164 in response to the test mode signal TDRM which is inactivated during the normal mode. As a result, the write driver 150 transfers data inputted from the data pad LDQ to its corresponding memory cells, i.e., memory cells coupled to GIO lines GIO_L, and the write driver 161 transfers data inputted from the data pad UDQ to its corresponding memory cells, i.e., memory cells coupled to GIO lines GIO_U. That is, each of the write drivers 150 and 161 receives and transfers respective data from the data pads LDQ and UDQ to memory cells in the banks 110 to 140.

The test mode control unit 200 receives data outputted from the GIO lines GIO_L and GIO_U. In the test mode, the test mode control unit 200 compares data of the GIO lines GIO_U with data of the GIO lines GIO_L in response to the test mode signal TDRM, and outputs the fail-stuck signal FAIL_STUCKD based on a comparison result.

Figure 2:
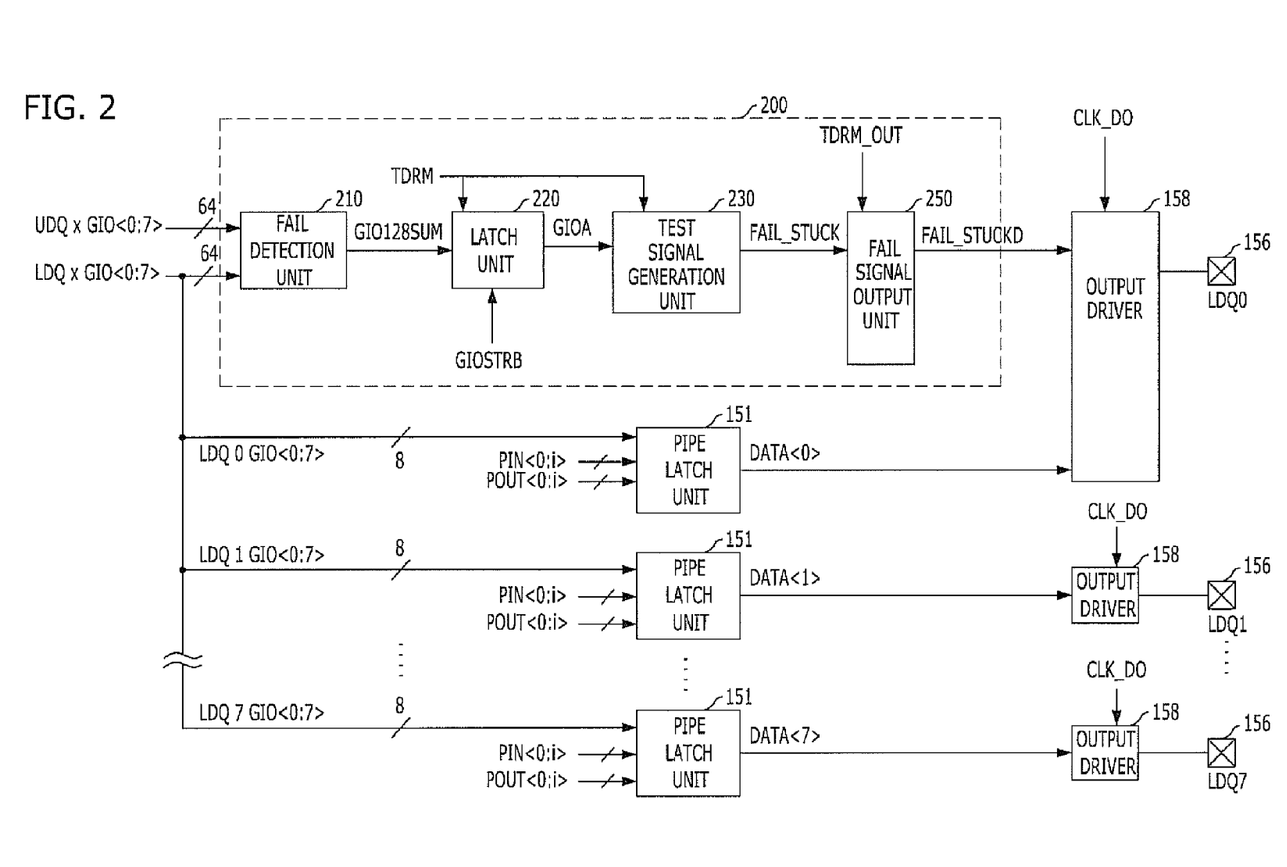
FIG. 2 is a block diagram illustrating a test mode control unit, an output driver, and a pipe latch unit shown in FIG. 1.

FIG. 2 is a block diagram illustrating the test mode control unit 200 shown in FIG. 1. Hereinafter, for sake of convenience, an exemplary case, in which 8 GIO lines GIO_U and 8 GIO lines GIO_L are provided, and 8 data pads LDQ and 8 data pads UDQ are provided will be explained as an example.

Referring to FIG. 2, the test mode control unit 200 includes a fail detection unit 210 and a latch unit 220, and a test signal generation unit 230, and a fail signal output unit 250.

The fail detection unit 210 compares data UDQ×GIO<0:7> of the GIO lines GIO_U with data LDQ×GIO<0:7> of the GIO lines GIO_L to output a fail detection signal GIO128SUM. The fail detection signal GIO128SUM is inactivated when any of the data UDQ×GIO<0:7> of the GIO lines GIO_U is different from a corresponding one of the data LDQ×GIO<0:7> of the GIO lines.

The latch unit 220 latches the fail detection signal GIO128SUM to output a fail latch signal GIOA in response to the test mode signal TDRM, and a strobe signal GIOSTRB. The strobe signal GIOSTRB may be generated based on a pipe input strobe signal PINSTB used in the pipe latch units 151 and 169, which is synchronized with a read command. In accordance with this exemplary embodiment of the present invention, during the package test mode, the latch unit 220 outputs the fail latch signal GIOA, which is stuck in a predetermined logic level after the fail detection signal GIO128SUM is inactivated, regardless of the strobe signal GIOSTRB.

The test signal generation unit 230 generates a test signal FAIL_STUCK based on the fail latch signal GIOA and the test mode signal TDRM.

The fail signal output unit 250 receives the test signal FAIL_STUCK and outputs the fail-stuck signal FAIL_STUCKD in response to a test output signal TDRM_OUT. Here, the test output signal TDRM_OUT is activated after the test data of the GIO line GIO_L are outputted through first to eighth data pads LDQ0 to LDQ7 by the pipe latch unit 151 at a test mode such as the package test mode. Here, the fail signal output unit 250 outputs the fail-stuck signal FAIL_STUCKD to drive the first data pad LDQ0 to a high/low-stuck state.

As describe above, in the normal mode, the pipe latch unit 151 receives the data LDQ×GIO<0:7> from the GIO lines GIO_L, and output data DATA<0:7> to the output driver 158. As a result, the output driver 158 outputs the data DATA<0:7> to corresponding data pads among the first to eighth data pads LDQ0 to LDQ7, and thus the read operation is normally performed.

On the contrary, in the test mode, the test mode control unit 200 compares data UDQ×GIO<0:7> of the GIO lines GIO_U with data LDQ×GIO<0:7> of the GIO lines GIO_L, and outputs the fail-stuck signal FAIL_STUCKD in response to a comparison result. As a result, when a fail occurs, the output driver 158 drives the first data pad LDQ0 to a high-stuck state in response to the fail-stuck signal FAIL_STUCKD, and thus the first data pad LDQ0 shows a failure of the semiconductor memory device.

In FIG. 2, the fail-stuck signal FAIL_STUCKD is input to the output driver 158 driving the first data pad LDQ0. However, in a preferred embodiment, the fail-stuck signal FAIL_STUCKD may be input to all the output drivers 158 driving the first to eighth data pads LDQ0 to LDQ7 so that all the data pads LDQ0 to LDQ7 may denote a failure of the semiconductor memory device. In another embodiment, a switch unit may be provided between the fail signal output unit 250 and each of the output drivers 158 driving the second to eighth data pads LDQ1 to LDQ7. The switch unit may provide the fail-stuck signal FAIL_STUCKD to any number of selected output drivers 158 to control which of the data pads LDQ0 to LDQ& indicate a failure of semiconductor device. Further, the switch unit may be controlled by an external command, or may be implemented with a metal option.

Figure 3:
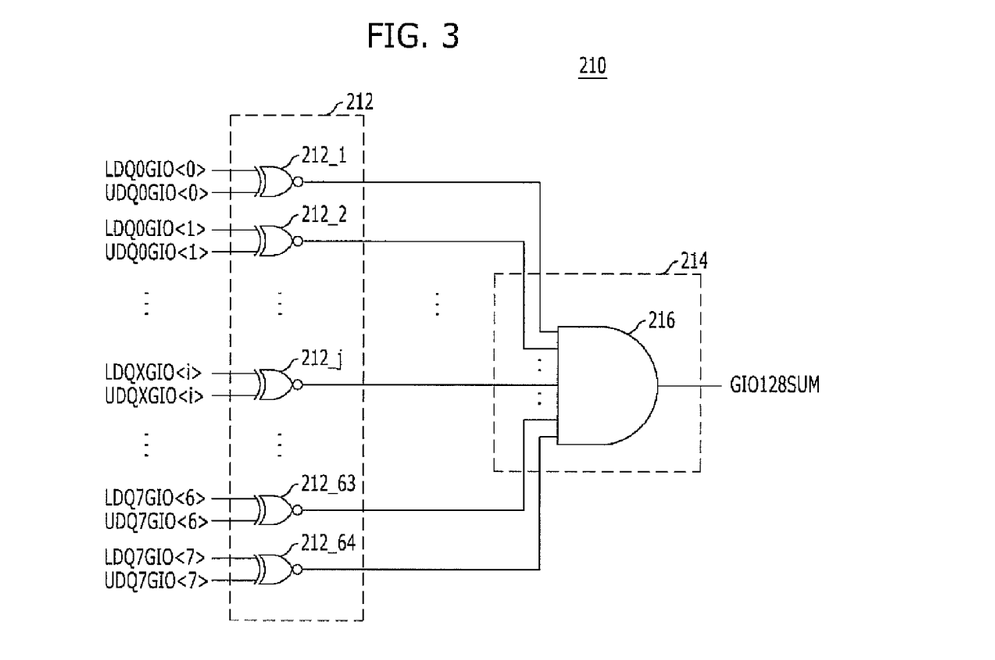
FIG. 3 is a circuit diagram illustrating a comparison unit shown in FIG. 2.

FIG. 3 is a circuit diagram illustrating the fail detection unit 210 shown in FIG. 2.

Referring to FIG. 3, the fail detection unit 210 includes a comparison unit 212 and a summation unit 214. The comparison unit 212 includes a plurality of, for example, XNOR gates 212_1 to 212_64 configured to receive the respective data UDQ×GIO<0:7> and LDQ×GIO<0:7>. The summation unit 214 includes, for example, an AND gate 216 configured to receive outputs of the plurality of XNOR gates 212_1 to 212_64.

Each of XNOR gates 212_1 to 212_64 activates its output signal when corresponding data UDQ×GIO<0:7> and LDQ×GIO<0:7> are identical with each other. The AND gate 216 activates the fail detection signal GIO128SUM when all the output signals of the XNOR gates 212_1 to 212_64 are activated, but inactivates the fail detection signal GIO128SUM when any one of the output signals of the XNOR gates 212_,1 to 212_64 is inactivated.

Accordingly, the fail detection unit 210 inactivates the fail detection signal GIO128SUM when any one of the data UDQ×GIO<0:7> is different from a corresponding one of the data LDQ×GIO<0:7>.

Figure 4A:
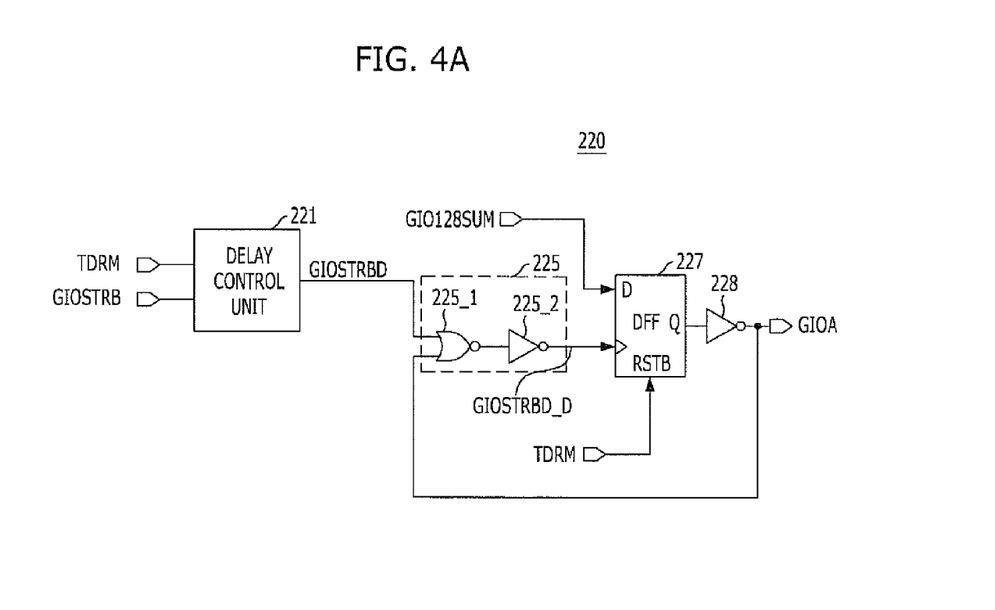
FIG. 4A is a circuit diagram illustrating a latch unit shown in FIG. 2.

FIG. 4A is a circuit diagram illustrating the latch unit 220 shown in FIG. 2.

Referring to FIG. 4A, the latch unit 220 includes a delay control unit 221, a combination unit 225, a D flip-flop 227, and an inverter 228.

The delay control unit 221 is enabled in response to the test mode signal TDRM, and delays the strobe signal GIOSTRB to output a delayed strobe signal GIOSTRBD. For reference, the delay control unit 221 delays the strobe signal GIOSTRB by a delay amount corresponding to a time taken by the fail detection unit 210 to generate the fail detection signal GIO128SUM. As a result, the delayed strobe signal GIOSTRBD is synchronized with the fail detection signal GIO128SUM. Here, the strobe signal GIOSTRB is generated based on a pipe input strobe signal PINSTB which is generated in synchronization with a read command.

The combination unit 225 combines the delayed strobe signal GIOSTRBD and the fail latch signal GIOA, which is fed back from the inverter 228, to output a clock signal GIOSTRBD_D of the D flip-flop 227. In detail, the combination unit 225 includes a NOR gate 225_1 and an inverter 225_2, which perform an OR operation on the fed-back fail latch signal GIOA and the delayed strobe signal GIOSTRBD.

The D flip-flop 227 latches the fail detection signal GIO128SUM in synchronization with the clock signal GIOSTRBD_D. Herein, the D flip-flop 227 is reset in response to the test mode signal TDRM.

Finally, the inverter 228 outputs the fail latch signal GIOA by inverting an output signal of the D flip-flop 227.

Hereinafter, referring to FIGS. 4A and 4B, an operation of the latch unit 220 is explained in detail.

Figure 4B:
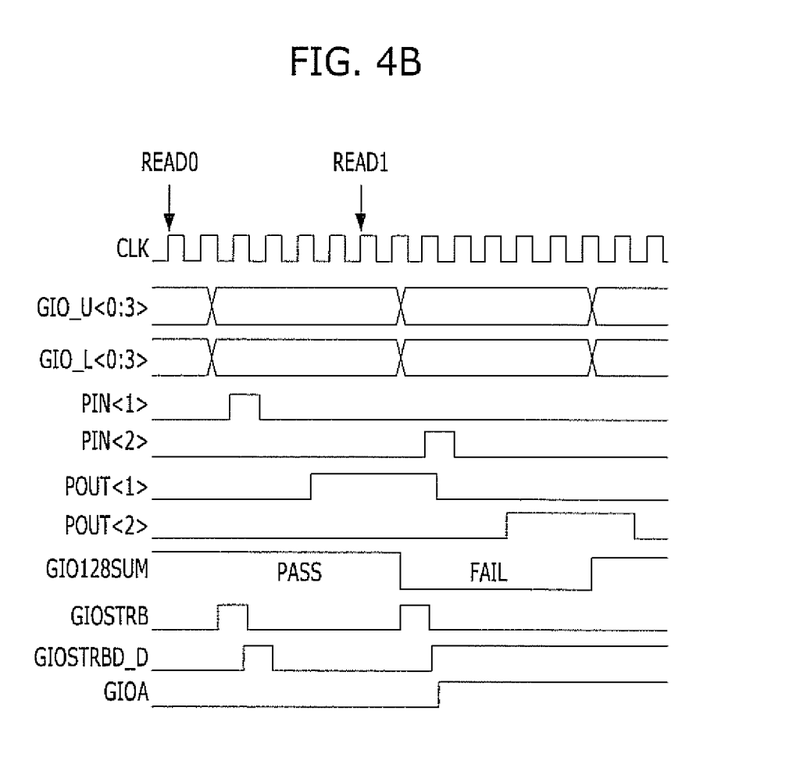
FIG. 4B is a timing diagram illustrating an operation of the latch unit in accordance with an exemplary embodiment of the present invention.

FIG. 4B is a timing diagram illustrating an operation of the latch unit 220.

In a test mode, test data are input from the data pad LDQ and transferred to the respective memory cells in the banks.

After a read command is input, the test data stored in the respective memory cells in the banks are loaded on the corresponding GIO lines GIO_L and GIO_U as data UDQ×GIO<0:7> and LDQ×GIO<0:7>. The delay control unit 221 of the latch unit 220 is enabled in response to the test mode signal TDRM, and outputs the delayed strobe signal GIOSTRBD by delaying the strobe signal GIOSTRB. The combination unit 225 outputs the clock signal GIOSTRBD_D to the D flip-flop 227 based on the delayed strobe signal GIOSTRBD, and the D flip-flop 227 latches the fail detection signal GIO128SUM in synchronization with the clock signal GIOSTRBD_D. Finally, the inverter 228 outputs the fail latch signal GIOA by inverting the output signal of the D flip-flop 227.

It is assumed that the fail detection signal GIO128SUM becomes inactivated in the package test mode. At this time, the combination unit 225 outputs the clock signal GIOSTRBD_D, which is fixed to a logic high level, based on the fail latch signal GIOA, which is fed back from the D flip-flop 227 and the inverter 228. As a result, the D flip-flop 227 is in a stuck state, and thus the fail latch signal GIOA is latched to a logic high level. Accordingly, in the package test mode, the latch unit 220 latches and outputs the fail latch signal GIOA having a logic high level once a fail occurs.

Figure 5:
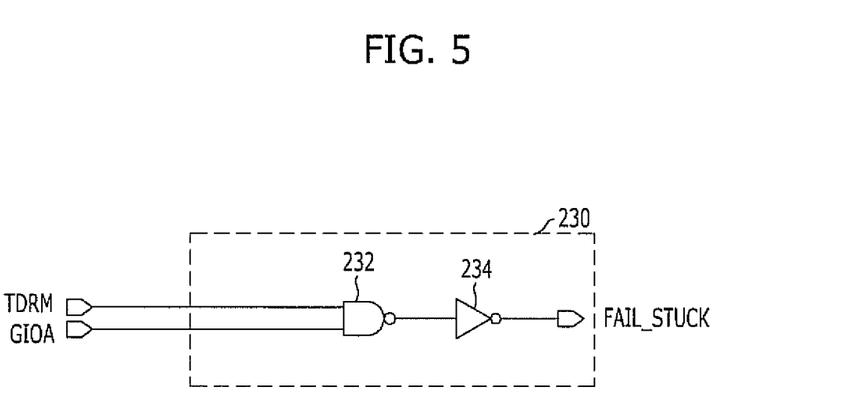
FIG. 5 is a block diagram illustrating a test signal generation unit shown in FIG. 2.

FIG. 5 is a block diagram illustrating a test signal generation unit 230 shown in FIG. 2.

Referring to FIG. 5, the test signal generation unit 230 includes a NAND gate 232 and an inverter 234. The NAND gate 232 and the inverter 234 perform an AND operation on the test mode signal TDRM and the fail latch signal GIOA, and output the test signal FAIL_STUCK. Accordingly, the test signal generation unit 230 outputs the fail latch signal GIOA as the test signal FAIL_STUCK when the test mode signal TDRM is activated in the package test mode.

Figure 6:
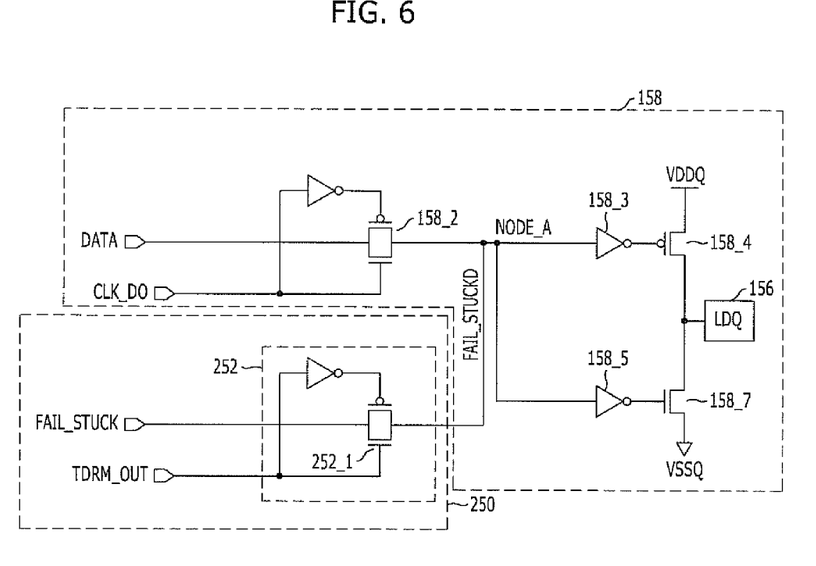
FIG. 6 is a circuit diagram illustrating a fail signal output unit and an output driver shown in FIG. 2.

FIG. 6 is a circuit diagram illustrating the fail signal output unit 250 and the output driver 158 shown in FIG. 2.

Referring to FIG. 6, the fail signal output unit 250 includes a fail-stuck signal output unit 252 which receives the test signal FAIL_STUCK to output the fail-stuck signal FAIL_STUCKD to a node NODE_A in response to the test output signal TDRM_OUT. The fail-stuck signal output unit 252 may be implemented with, for example, a transfer gate 252_1 configured to selectively output the test signal FAIL_STUCK as the fail-stuck signal FAIL_STUCKD in response to the test output signal TDRM_OUT.

In case where the test output signal TDRM_OUT is activated, the transfer gate 252_1 outputs the test signal FAIL_STUCK as the fail-stuck signal FAIL_STUCKD. On the contrary, in case where the test output signal TDRM_OUT is inactivated, the transfer gate 252_1 is disabled so as not to transfer the test signal FAIL_STUCK as the fail-stuck signal FAIL_STUCKD. Here, the test output signal TDRM_OUT is activated after the test data of the GIO line GIO_L are outputted through the data pad LDQ by the pipe latch unit 151 shown in FIG. 1, in the package test mode.

Meanwhile, the output driver 158 includes a transfer gate 158_2, inverters 158_3 and 158_5, a pull-up driver 158_4, and a pull-down driver 158_7.

The transfer gate 158_2 receives input data DATA to the node NODE_A in response to a clock signal CLK_DO. The inverter 158_3 inverts a signal at the node NODE_A to drive the pull-up driver 158_4, and the inverter 158_5 inverts the signal at the node NODE_A to drive the pull-down driver 158_7. The pull-up driver 158_4 and pull-down driver 158_7 are turned on/off in response to outputs of the inverters 158_3 and 158_5, respectively.

In the normal mode, the test signal FAIL_STUCK is inactivated. During a read operation, the output driver 158 drives the input data DATA to be pulled up or pulled down in response to the clock signal CLK_DO. Though it is not shown, after the read operation is finished, both of the pull-up driver 158_4 and the pull-down driver 158_7 may be driven to be turned off. As a result, the data pad LDQ is in a high-impedance state after the read operation is finished.

During the package test mode, since the test output signal TDRM_OUT is activated after data of the GIO line GIO_L are outputted to the data pad LDQ, the fail-stuck signal output unit 252 outputs the fail-stuck signal FAIL_STUCKD based on the test signal FAIL_STUCK. When the fail-stuck signal FAIL_STUCKD is activated due to a failure, the pull-up driver 158_4 is turned on while the pull-down driver 158_7 is turned off. Accordingly, the data pad LDQ becomes a supply voltage level, and maintains a high-stuck state in response to the fail-stuck signal FAIL_STUCKD.

Hereinafter, referring to FIGS. 1 to 7B, an operation of the semiconductor memory device is explained in detail.

Figure 7A:
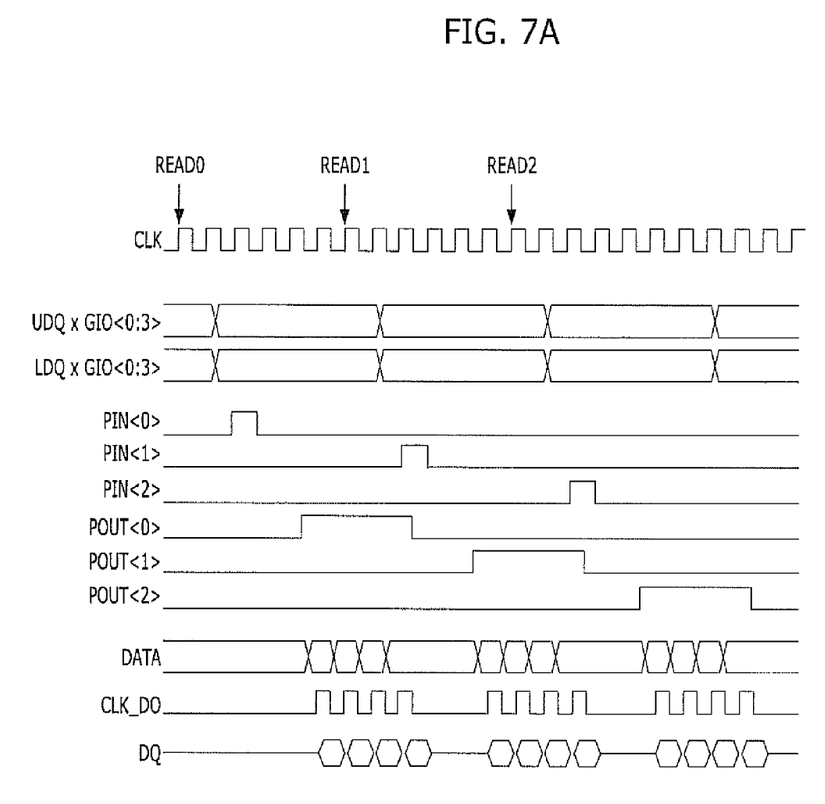
FIGS. 7A and 7B are timing diagrams illustrating an operation of a semiconductor memory device in accordance with an exemplary embodiment of the present invention.
Figure 7B:
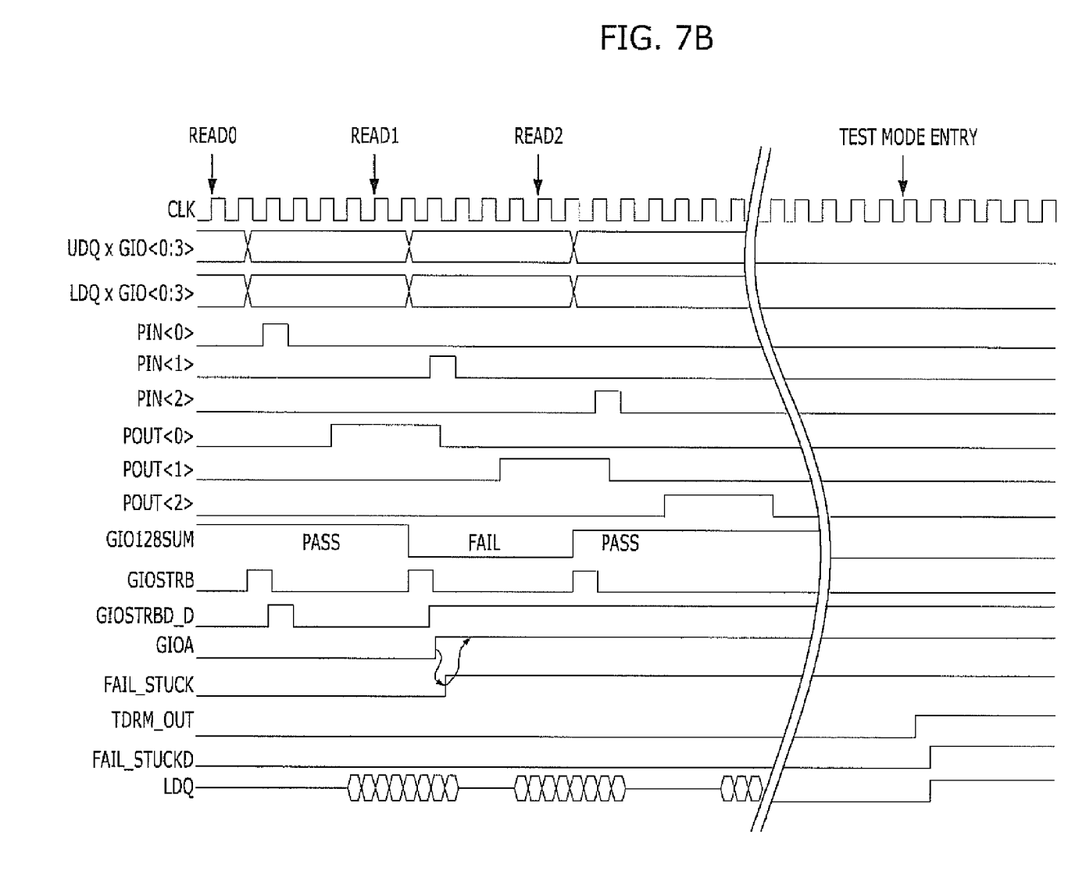

FIGS. 7A and 7B are timing diagrams illustrating an operation of a semiconductor memory device in accordance with an exemplary embodiment of the present invention. More specifically, FIG. 7A is a timing diagram illustrating an operation in the normal mode, and FIG. 7B is a timing diagram illustrating an operation of the package test mode.

Referring to FIG. 7A, in the normal mode, data stored in the respective memory cells in the banks are loaded on the corresponding GIO lines GIO_L and GIO_U when a read command is input. The pipe latch units 151 and 169 receive and latch the data of the GIO lines GIO_L and GIO_U in response to the pipe latch input control signals PIN<0:4>, and output the data to the data pads LDQ and UDQ in response to the pipe latch output control signals POUT<0:4>. For reference, though it is not shown, after each read operation is finished, both of the pull-up driver 158_4 and the pull-down driver 158_7 are driven to be turned off. As a result, the data pad LDQ is in a high-impedance state after each read operation is finished.

Referring to FIG. 7B, in the package test mode, data stored in the respective memory cells of the banks are loaded on the corresponding GIO lines GIO_L and GIO_U when a read command is input. The fail detection unit 210 of the test mode control unit 200 compares data UDQxGIO<0:7> of the GIO lines GIO_U with data LDQxGIO<0:7> of the GIO lines GIO_L to output the fail detection signal GIO128SUM. The latch unit 220 latches the fail detection signal GIO128SUM in response to the strobe signal GIOSTRB activated in synchronization with each read command.

When any of the data UDQxGIO<0:7> of the GIO lines GIO_U is different from a corresponding one of the data LDQ x GIO<0:7> of the GIO lines GIO_L, the fail detection signal GIO128SUM is inactivated and the fail latch signal GIOA is activated.

At this time, the activated fail latch signal GIOA is fed back to the combination unit 225, and the combination unit 225 outputs the clock signal GIOSTRBD_D to be stuck at a certain logic level. As a result, the latch unit 220 outputs the fail latch signal GIOA to be stuck at a certain logic level once the fail detection signal GIO128SUM is inactivated, regardless of the strobe signal GIOSTRB.

The test signal generation unit 230 generates the test signal FAIL_STUCK based on the fail latch signal GIOA and the test mode signal TDRM. When the test output signal TDRM_OUT is activated after the data of the GIO line GIO_L are outputted through the data pad LDQ, the fail signal output unit 250 activates the fail-stuck signal FAIL_STUCKD to drive the data pad LDQ to a high/low-stuck state. Accordingly, in the package test mode, after the data of the GIO lines GIO_L are outputted through the data pad LDQ, the data pad LDQ may be driven to a high/low-stuck state so as to show a fail status.

In accordance with the exemplary embodiment of the present invention, in a test mode, data input from a data pad LDQ are simultaneously transferred to both of GIO lines GIO_L and GIO_U, which are coupled to a plurality of unit cells in banks, and a test mode control unit compares data of the GIO lines GIO_U with data of the GIO lines GIO_L to output a fail signal based on a comparison result. Accordingly, a time for testing the plurality of unit cells in the banks can be reduced/decreased.

Furthermore, in accordance with the exemplary embodiment of the present invention, various methods for denoting a fail status is provided according to a test mode. For example, in the package test mode, the test mode control unit outputs the fail signal to maintain a predetermined logic level once the memory cells having a defect are detected. Thereafter, an output driver drives the data pad LDQ to be stuck in a high/low state in response to the test output signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, any numbers of elements illustrated and described herein are by way of example only. The present invention is limited only as defined in the following claims and equivalents thereof.

What is claimed is:

1. A semiconductor memory device, comprising:
   a plurality of banks, each including a plurality of first memory cells and a plurality of second memory cells;
   a first input/output unit configured to transfer first data between the first memory cells and a plurality of first data pads;
   a second input/output unit configured to transfer second data between the second memory cells and a plurality of second data pads;
   a path selection unit configured to transfer the first data, which are input through the first data pads, to both the first and second memory cells, during a test mode; and
   a test mode control unit configured to compare the first data of the first and second memory cells, and to control at least one of the first data pads to denote a fail status based on a comparison result, during the test mode, wherein the test mode control unit controls the one of the first data pads to a stuck state after a read operation is finished,
   wherein the test mode control unit comprises:
      a fail detection unit configured to compare the first data of the first memory cells with the first data of the second memory cells to output a fail detection signal based on the comparison result;
      a latch unit configured to latch the fail detection signal and to output a fail latch signal in response to a test mode signal which is activated during the test mode, and a strobe signal which is toggled when a read command is input;
      a test signal generation unit configured to generate a test signal based on the fail latch signal and the test mode signal: and
      a fail signal output unit configured to output a fail signal in response to the test signal and a test output signal, which is activated after data are output through the first data pads.

2. The semiconductor memory device of claim 1, further comprising an input/output driver configured to drive the first data pads to denote a fail status in response to the fail signal.

3. The semiconductor memory device of claim 1, wherein the fail detection unit comprises:
   a plurality of comparison units configured to compare the first data of the first memory cells with the first data of the second memory cells; and
   a summation unit configured to output the fail detection signal based on outputs of the comparison units.

4. The semiconductor memory device of claim 3, wherein the comparison units each comprise an XNOR gate, each of which activates its output signal when corresponding first data are identical with each other.

5. The semiconductor memory device of claim 3, wherein the summation unit comprises a logic gate to perform an AND operation on the outputs of the comparison units.

6. The semiconductor memory device of claim 1, wherein the latch unit outputs the fail latch signal to be stuck at a certain logic level once the fail detection signal is inactivated, regardless of the strobe signal.

7. The semiconductor memory device of claim 1, wherein the latch unit includes:
   a delay control unit configured to delay the strobe signal and to output a delayed strobe signal;
   a combination unit configured to output a clock signal based on the delayed strobe signal and the fail latch signal; and
   a D flip-flop configured to output the fail latch signal by latching the fail detection signal in synchronization with the clock signal.

8. The semiconductor memory device of claim 7, wherein the delay control unit has a delay amount corresponding to a time taken to generate the fail detection signal by the fail detection unit so as to synchronize the delayed strobe signal with the fail detection signal.

9. The semiconductor memory device of claim 7, wherein the delay control unit and the D flip-flop are enabled in response to the test mode signal.

10. The semiconductor memory device of claim 7, wherein the combination unit comprises:
   a first logic gate configured to perform a NOR operation on the delayed strobe signal and the fail latch signal; and
   a second logic gate configured to invert an output of the first logic gate to output the clock signal.

11. The semiconductor memory device of claim 1, wherein the test signal generation unit performs an AND operation on the fail latch signal and the test mode signal.

12. The semiconductor memory device of claim 1, wherein the fail signal output unit comprises a transfer gate configured to output the test signal as the fail signal in response to the test output signal.

13. A method for testing a semiconductor memory device, the method comprising:
   transferring data, which is input through a data pad, to first and second memory cells of a bank;
   comparing the data of the first memory cell with the data of the second memory cell to output a fail detection signal based on the comparison result;
   generating a fail latch signal by latching the fail detection signal in response to a test mode signal which is activated during the test mode, and a strobe signal which is toggled when a read command is input;
   generating a test signal based on the fail latch signal and the test mode signal;
   generating a fail signal based on the test signal and a test output signal, which is activated after data are output through the first data pads; and
   driving at least one of the data pad to denote a fail stuck status based on the fail signal, wherein the data pad is driven to the fail stuck state after a read operation is finished.

14. The method of claim 13, the fail latch signal is generated to be stuck at a certain logic level when the fail detection signal is inactivated, regardless of the strobe signal.

15. The method of claim 13, wherein the generating of the fail latch signal comprises:
   delaying the strobe signal to output a delayed strobe signal;
   generating a clock signal based on the delayed strobe signal and the fail latch signal; and
   outputting the fail latch signal by latching the fail detection signal in synchronization with the clock signal.

16. The method of claim 15, wherein the strobe signal is delayed by a delay amount required to synchronize the delayed strobe signal with the fail detection signal.

* * * * *